June 13, 1961 S. W. TEHON 2,988,714
PIEZOELECTRIC FILTER NETWORK
Filed Sept. 12, 1957 2 Sheets-Sheet 1
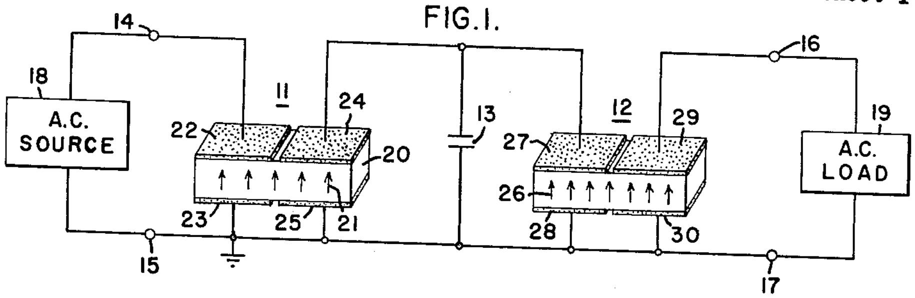
FIG. 2.
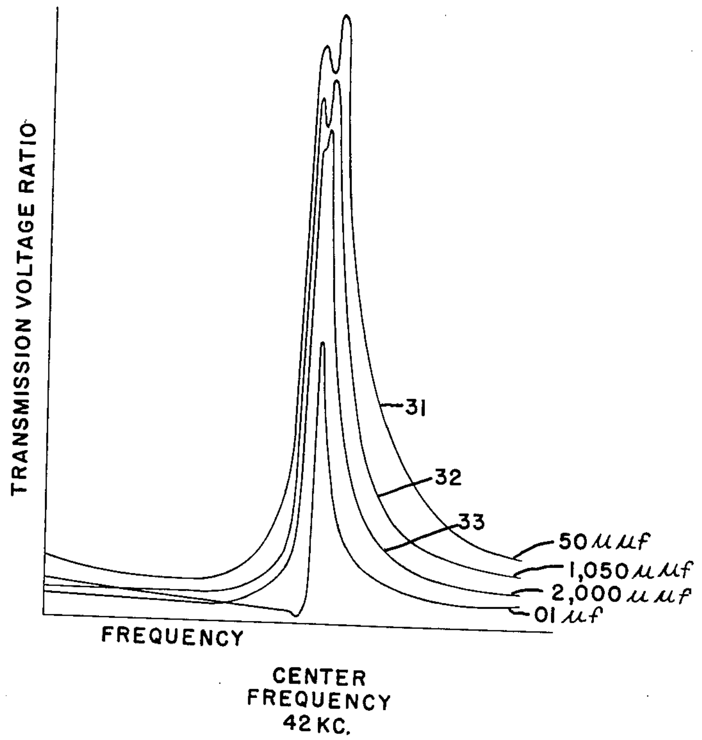
FIG. 3a.
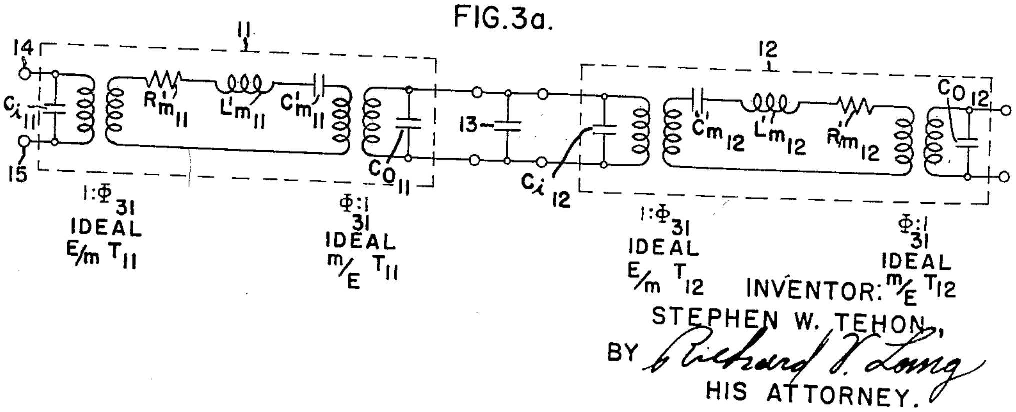
INVENTOR: STEPHEN W. TEHON,
BY Richard V. Long
HIS ATTORNEY.

June 13, 1961 S. W. TEHON 2,988,714

PIEZOELECTRIC FILTER NETWORK

Filed Sept. 12, 1957

2 Sheets-Sheet 2

INVENTOR:
STEPHEN W. TEHON,
BY Richard V. Lang
HIS ATTORNEY.

2,988,714

PIEZOELECTRIC FILTER NETWORK

Stephen W. Tehon, Clay, N.Y., assignor to General Electric Company, a corporation of New York Filed Sept. 12, 1957, Ser. No. 683,486
8 Claims. (Cl. 333—72)

The present invention relates to filter networks and in particular to an improved filter network employing cascaded piezoelectric transformers.

Piezoelectric transformers are resonantly operated devices for achieving electrical transformations through the use of the direct and inverse piezoelectric properties of the transformer material. Such devices have been described in U.S. application, Serial No. 439,992, filed June 29, 1954, on behalf of C. A. Rosen et al., now Patent No. 2,830,274. These devices exhibit the transmission properties of a single-tuned resonant circuit of relatively high "Q," having a narrow pass band and only moderate "skirt" attenuation. In the interests of improving these response characteristics, thus to broaden and to make more uniform the transmission band, and to achieve greater "skirt" attenuation it has been felt desirable to cascade a plurality of piezoelectric transformers. It was felt that by cascading one could achieve the flattened pass bands and heightened skirt attenuations which usually accompany double or multiple tuned filter circuits. When ordinary cascading arrangements were attempted, however, it was found that improved transmission characteristics did not generally result. The pass bands were usually irregular, being filled with peaks and notches, and were thus generally unsatisfactory.

It is accordingly an object of the present invention to provide a filter employing a plurality of piezoelectric transformers wherein cascading has been effectively achieved.

It is another object of the present invention to provide a new and improved band pass filter.

These and other objects of the present invention have been achieved by employing in a band pass filter having at least a pair of cascaded piezoelectric transformers, a capacitance in the cascading circuit, coupled in series or in shunt between the output terminals of an initial transformer and the input terminals of the following transformer. This capacitance is then proportioned in a predetermined relation to the electrical capacitances equivalent to the compliances of the piezoelectric members of the piezoelectric transformers and the respective clamped terminal capacitances of the transformers, all of which capacitances together function in the near resonance transmission region as an all capacitance coupling network. By appropriate selection of values for the capacitance in the cascading circuit to achieve a desired coupling coefficient with respect to the mechanical Q of the piezoelectric members, the composite filter may be made to exhibit a flattened pass band with the heightened skirt attenuation usually exhibited by properly coupled, multiple tuned circuits.

In accordance with the invention, the applicant has discovered that to successfully cascade piezoelectric transformers, one must take definite precautions to achieve the proper degree of coupling between piezoelectric transformers. Applicant has further discovered that the compliances of the piezoelectric bodies of the transformers may be treated as having an electrical effect similar to that of capacitances. If these compliances after conversion into suitable electrical units are treated as electrical capacitances, then by the use of a single capacitor, selected by use of well-known circuit analysis to be of proper size in relation to the equivalent compliant capacitances and the respective clamped terminal capacitances of the transformer, one can obtain the desired degree of coupling. In effect, the additional capacitor working in conjunction with the compliant capacitances and terminal capacitances, provides a new coupling mechanism between the cascaded transformers, equivalent to that of an all capacitance type coupling network. By proper selection of a shunting or series position for this capacitance, by proper selection of the value of this capacitance in accordance with the above parameters of the transformer, and by proper selection of a proper coupling coefficient with respect to the mechanical Q of the piezoelectric members, the piezoelectric transformers may be cascaded effectively and smooth pass band responses may be obtained. These equivalent capacitances coupling networks take the form, or are readily convertible into the form, of T or Π type capacitance coupling networks, thus leading to rather simple, predictable operation. These measures give a very simple and effective control of the coupling coefficient between the two transformers, and may be used to convert the customary highly overcoupled relationship to critical or even below critical coupling.

The features of the invention which are believed to be novel are set forth with particularity in the appended claims. The invention itself, however, both as it is organization and method of operation, together with further objects and advantages thereof, may best be understood by reference to the following description when taken in connection with the drawings, wherein:

FIGURE 1 illustrates a first embodiment of the invention;

FIGURE 2 is a graph illustrating the transmission characteristics of the first embodiment of the invention;

Figure 3B:
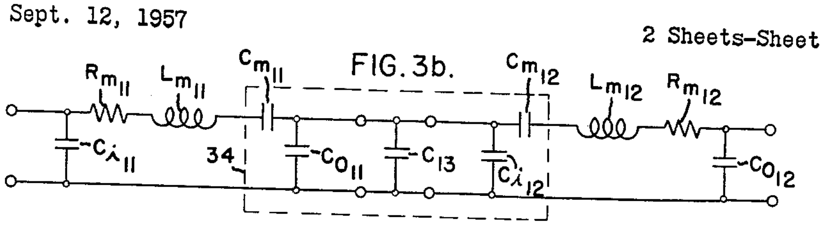
Figure 3C:
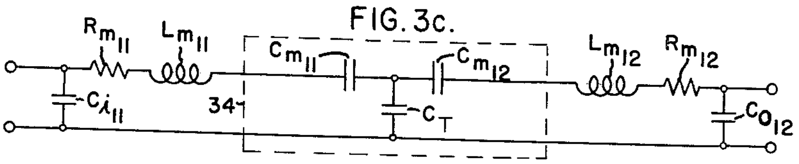
Figure 4:
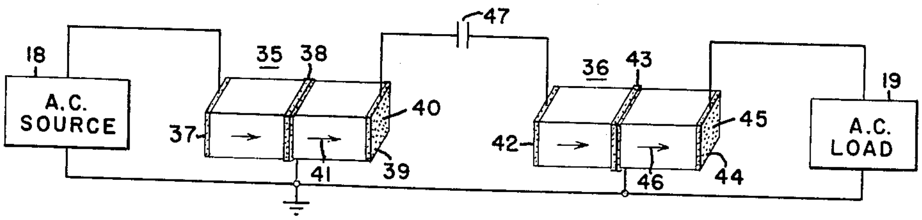

FIGURE 3*a* is an equivalent circuit representation of the first embodiment;

FIGURES 3*b* and 3*c* are simplified equivalent circuit representations of the first embodiment;

FIGURE 4 is a second embodiment of the present invention; and

Figure 5A:
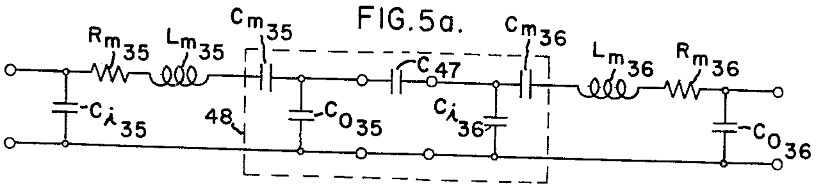
Figure 5B:
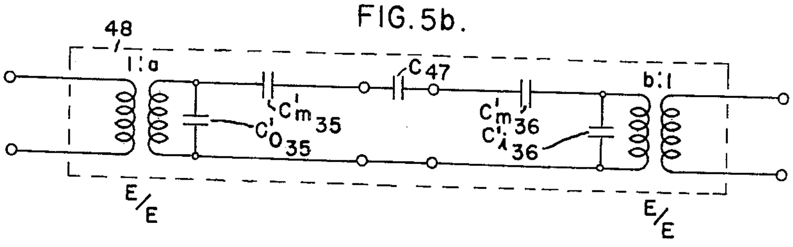
Figure 5C:
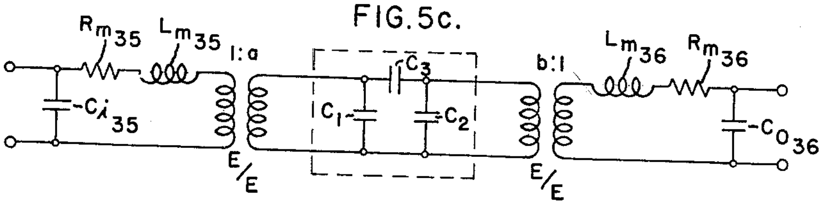

FIGURES 5*a*, 5*b* and 5*c* are equivalent circuit representations descriptive of the second embodiment, FIGURES 5*a* and 5*c* being equivalent circuit representations of the entire filter network whereas FIGURE 5*b* is an equivalent circuit representation of only a portion of the second embodiment.

A novel bandpass filter incorporating the present invention is illustrated in FIGURE 1. This filter comprises a first piezoelectric transformer 11, a second piezoelectric transformer 12 and a coupling reducing capacitance 13. The input terminals of the filter are shown at 14 and 15 respectively, the terminal 15 being grounded, and the output terminals of the filter are shown at 16 and 17 respectively, the terminal 17 being grounded. As illustrated in FIGURE 1, an A.C. source 18 is shown connected between the input terminals 14 and 15, and an alternating current load 19 is shown connected between the output terminals 16 and 17. It should be understood that the A.C. source 18 may take any of a large number of forms in practical applications, and may for instance be a vacuum tube or transistor as one might find in the intermediate frequency amplifier of a conventional radio receiver. The A.C. load device 19 may likewise take any of a large number of conventional forms, and typically may be the second detector of a radio receiver.

The piezoelectric transformers 11 and 12 illustrated in FIGURE 1 are of similar design. Piezoelectric transformers are resonantly operated electromechanical devices providing efficient electrical transformations in the region of resonance. They are characterized by high Q's, usually substantially higher than can be obtained by coil devices and yet less than achieved in quartz. In general, these devices function by an initial direct piezoelectric conversion of electrical energy to mechanical energy, an intermediate mechanical filtering action dependent primarily upon the mechanical resonance properties of the piezoelectric body, and an ultimate reconversion of mechanical energy to electrical energy. For a further discussion of piezoelectric transformers reference is made to U.S. application, Serial No. 439,992, filed on behalf of C. A. Rosen et al. on June 29, 1954, now Patent No. 2,830,274.

The piezoelectric transformer 11 is formed of an elongated body member 20 of square cross section although other geometries are equally satisfactory. The body member is composed of a polycrystalline aggregate of ceramic material exhibiting piezoelectric properties and having as a principal component barium titanate. Other piezoelectric materials, particularly the ferroelectric ceramics exhibiting electrostriction may also be employed. In the exemplary embodiment in which mechanical resonance occurs at approximately 42 kilocycles, the dimensions of the body member are ¼ inch by ¼ inch by 2 inches in length. The piezoelectric bar is polarized (as indicated by the arrows 21) in a direction perpendicular to the major axis of the body 20. Four electrodes 22, 23, 24 and 25 are applied to the body member 20. These electrodes are placed on two opposed surfaces selected with respect to the polarization arrows so that a line joining the electroded surfaces and perpendicular to these surfaces is parallel to the direction of polarization. The electrodes each extend along the surface of the body member 20 from one end of the body to approximately the middle and extend approximately across the full width of the body member. The electrodes are applied by painting on of one of several known silver compositions which is subsequently fired to produce the metallic conductive silver. Vapor deposition of other conductors may also be used. The opposed pair of electrodes 22 and 23 shown at the left hand portion of the body member 20 form the input electrodes of the bar. The electrode 22 is coupled to the filter input terminal 14 and the electrode 23 is coupled to the grounded filter input terminal 15. The pair of electrodes 24 and 25 illustrated at the right hand portion of the body member 20 form the output electrodes, electrode 24 being coupled to one ungrounded terminal of the coupling capacitor 13 and the electrode 25 being coupled to the other terminal of the capacitor 13 which is grounded to the filter terminal 15. In a circuit in which a common ground connection is employed in primary and secondary circuits, the electrodes 23 and 25 may be continuous.

The piezoelectric transformer 12 is similar in design to that previously described being polarized in the direction illustrated by the arrows 26 and being provided with a pair of input electrodes 27 and 28 and a pair of output electrodes 29 and 30 similarly arranged to those used in the transformer 11. The input electrodes 27 and 28 are coupled respectively to the ungrounded and grounded terminals of the capacitor 13 and the output electrodes 29 and 30 are coupled respectively to the ungrounded filter output terminal 16 and the grounded filter output terminal 17.

The use of the capacitor 13 in the above arrangement has been found to provide a substantial improvement in the response characteristics of the overall filter. If the capacitor 13 is omitted, and the transformers 11 and 12 are selected to have approximately the same resonant frequencies, then the response curve of the filter is found to be similar to that of two greatly overcoupled tuned circuits giving rise to two very sharp and closely spaced peaks separated by a deep trough. This characteristic is illustrated by curve 31 of FIGURE 2. If, however, a capacitor 13 of optimum value is now introduced, the trough in the response characteristic indicative of overcoupling disappears. The curve 32 illustrates an experimental response curve in which the capacitor 13 is 1050 micromicrofarads, a value slightly less than that required to bring about critical coupling. The curve 33 illustrates the response when a capacitor of 2000 micromicrofarads is employed. In the above arrangement, approximately 1300 micromicrofarads were found to give critical coupling.

It may thus be seen that by the selection of an appropriate shunting capacitance, a pair of narrow-band, high-Q piezoelectric transformers may be cascaded in such a fashion as to provide a critically coupled two section filter. An explanation of how this occurs may now be undertaken with reference to FIGURES 3*a*, 3*b* and 3*c*. It has been found that a piezoelectric transformer may be equivalently represented as shown in FIGURE 3*a*, dotted outlines 11 and 12 respectively representing the piezoelectric transformers 11 and 12. In general, each of the piezoelectric transformers may be treated as having an initial idealized transformer E/M $T_{11}$, where the subscript 11 denotes transformer 11 which converts electrical energy to mechanical energy, the turns ratio being 1 to $\Phi_{31}$, the electromechanical conversion ratio. The primary terminals of this idealized transformer are shunted by a fixed capacitance $C_{I11}$, the "clamped" input capacity of the piezoelectric transformer. The input terminals of the idealized transformer E/M $T_{11}$ are connected to the input terminals 14 and 15 of the filter unit. The piezoelectric transformer has a second idealized transformer M/E $T_{11}$ which performs the mechanical to electrical conversion and whose output terminals are also shunted by a capacitance $C_{O11}$, the output "clamped" capacitance. The turns ratio of the second ideal transformer is $\Phi_{31}$ to 1. Interconnecting the output terminals of the initially considered idealized transformer and the input terminals of the second idealized transformer is a circuit representing in electrical symbols the mechanical properties of the bar. These properties are represented by $R'_{m11}$, denoting the viscous damping, $L'_{m11}$ denoting one half the mass, and $C'_{m11}$ denoting the mechanical compliance and all three are serially connected between one output winding lead of the first idealized transformer and one input winding lead of the second idealized transformer. The other two leads of these last mentioned windings are connected together to complete the circuit. The mechanical quantities $R'_{m11}$, $L'_{m11}$, $C'_{m11}$ all take the form of a mechanically resonant circuit similar in appearance to a series resonant electrical circuit, leading one to expect a selective transmission characteristic in the region of resonance. In general, since the lossy component is small in typical piezoelectric ceramic materials, such as barium titanate, these transformers are relatively high Q devices exhibiting highly selective transmission characteristics. The above discussion of transformer 11 applies also to transformer 12, for which similar quantities are likewise defined, bearing the subscript 12.

The equivalent circuit diagram shown in FIGURE 3*a* may be simplified for purposes of explanation of the invention by considering the idealized transformer M/E $T_{11}$ at the output portion of the first transformer 11 as having been translated into proximity with the input idealized transformer E/M $T_{11}$. This translation has the effect of bringing the quantities $R'_{m11}$, $L'_{m11}$ and $C'_{m11}$ into the electrical portion of the circuit, requiring an appropriate assignment of electrical units. This conversion requires the use of the electromechanical conversion ratio $\Phi_{31}$, as follows:

$$R'_{m11}=R_{m11}/\Phi_{31}^2$$
$$L'_{m11}=L_{m11}/\Phi_{31}^2 \qquad (1)$$
$$C'_{m11}=C_{m11}\Phi_{31}^2$$

where $R_{m11}$ may now be denoted the equivalent electrical loss or resistance, $L_{m11}$ may be denoted the mass equivalent electrical inductance, $C_{m11}$ may be denoted the compliance equivalent electrical capacitance, or compliant capacitance. The quantity $\Phi_{31}$ is defined by the following equation $$\Phi_{31}=C_o\frac{k_{31}^2}{1-k_{31}^2}\left(\frac{2}{L}\right)\left(\frac{1}{d_{31}}\right) \quad (2)$$

where $C_o$ is the associated clamped output capacitance,
L is the length of the piezoelectric body,
$d_{31}$ is the piezoelectric strain constant equal to the ratio of the strain to applied field with constant stress and denoting an orthogonal relationship between applied field and the resultant strain, and
$k_{31}$ is the electromechanical coupling coefficient usually defined as the square root of the ratio of stored mechanical energy to stored electrical energy, the notation denoting an orthogonal relationship between strain and applied field. $k_{31}$ may also be defined in terms of $d_{31}$, being equal to $$k_{31}=d_{31}\sqrt{\frac{Y^E_1}{\epsilon_{33}{}^T}}$$

where $\epsilon_{33}{}^T$ is the permittivity of the material assuming constant stress in a direction parallel to the electric field, and
$Y^E_1$ is Young's modulus, assuming a constant field, measured at right angles to the direction of polarization.

This translation has a further effect of providing at the input portion of the equivalent representation of the transformer 11 a combination of an electrical to mechanical transformer and a mechanical to electrical transformer, each performing conversions of reciprocal magnitudes. Accordingly, it may be seen that these tow transformers do in fact together provide an electrical to electric conversion without change in magnitude and the two transformers may be eliminated from the circuit as indicated in the preliminary portion of FIGURE 3*b*. In a similar fashion the initial idealized transformer E/M $T_{12}$ and the final idealized transformer M/E $T_{12}$ of the output piezoelectric transformer 12 may be consolidated and removed from the equivalent circuit representation as shown in the right hand portion of FIGURE 3*b*. It may further be observed that the simplified equivalent representation of FIGURE 3*b* has in the central region defined by the dotted outline 34, a purely capacitive network comprising a total of 5 capacitances. Two of these capacitances are series capacitances corresponding to the electrical equivalents of the compliance of the body members 20 ($C_{m11}$ and $C_{m12}$) and the three shunt capacitances correspond respectively to the output clamped capacitance $C_{o11}$ of the input transformer 11, the coupling reducing capacitance $C_{13}$, and the input clamped capacitance $C_{i12}$ of the output transformer 12. These three shunt capacitances may be lumped together since they are coupled in parallel to provide a T type coupling network as shown in FIGURE 3*c* and may now be designated $C_T$:

$$C_T=C_{o11}+C_{13}+C_{i12} \quad (3)$$

The electrical properties of the network 34 may now be considered. In general, one may state of any coupling network that $$K^2=\frac{Z_{12}^2}{Z_{11}Z_{22}} \quad (4)$$

where

K is the coefficient of electrical coupling of the two circuits,
$Z_{12}$ is the mutual impedance of the network measured by dividing the open circuit output voltage by the input current,
$Z_{11}$ is the input circuit impedance measured with the output terminals open circuited, and $Z_{22}$ is the output impedance measured with the input terminals open circuited. These generalized network parameters take the following values in the network 34:

$$Z_{12}=\frac{1}{jwC_T}$$

$$Z_{11}=\frac{1}{jwC_{m11}}+\frac{1}{jwC_T} \quad (5)$$

$$Z_{22}=\frac{1}{jwC_{m12}}+\frac{1}{jwC_T}$$

where $1/jwC_{m11}$ is the electrical reactance corresponding to the compliant capacitance of piezoelectric transformer 11,
$1/jwC_{m12}$ is the electrical reactance corresponding to the compliant capacitance of the piezoelectric transformer 12, and
$1/jwC_T$ is the electrical reactance of capacitance $C_T$.

Substituting these quantities into Expression 4, we find $$K^2=\frac{\left(\frac{1}{jwC_T}\right)^2}{\left(\frac{1}{jwC_{m11}}+\frac{1}{jwC_T}\right)\left(\frac{1}{jwC_{m12}}+\frac{1}{jwC_T}\right)} \quad (6)$$

Dividing through by the numerator:

$$K^2=\frac{1}{\left(\frac{C_T}{C_{m11}}+1\right)\left(\frac{C_T}{C_{m12}}+1\right)} \quad (7)$$

To achieve critical coupling:

$$K\sqrt{Q_{11}Q_{12}}=1;\text{ or } K^2Q_{11}Q_{12}=1 \quad (8)$$

where $Q_{11}$ is the effective Q of the transformer 11, and
$Q_{12}$ is the effective Q of the transformer 12.

In general it may be stated that these Q's may include loss elements in both the transformer itself and the associated load and source devices the losses being combined additively.

Substituting Equation 7 into 8:

$$\frac{Q_{11}Q_{12}}{\left(\frac{C_T}{C_{m11}}+1\right)\left(\frac{C_T}{C_{m12}}+1\right)}=1 \quad (9)$$

Simplifying and setting up a quadratic expression in terms of $C_T$:

$$C_T^2+(C_{m11}+C_{m12})C_T+C_{m11}C_{m12}(1-Q_{11}Q_{12})=0 \quad (10)$$

Solving $$C_T=-\left(\frac{C_{m11}+C_{m12}}{2}\right)\pm\sqrt{\frac{(C_{m11}+C_{m12})^2}{4}+(Q_{11}Q_{12}-1)C_{m11}C_{m12}} \quad (11)$$

Factoring $$C_T=\frac{C_{m11}+C_{m12}}{2}\left[-1\pm\sqrt{1+\frac{4(Q_{11}Q_{12}-1)C_{m11}C_{m12}}{(C_{m11}+C_{m12})^2}}\right] \quad (12)$$

Assuming that $100C_{m11}<C_{m12}<100C_{m11}$; and that both $Q_{11}$ and $Q_{12}$ exceed 100, then with an accuracy usually greater than 1% we may simplify Expression 12 as follows:

$$C_T\cong\frac{C_{m11}+C_{m12}}{2}\left[-1\pm\sqrt{\frac{4Q_{11}Q_{12}C_{m11}C_{m12}}{(C_{m11}+C_{m12})^2}}\right] \quad (13)$$

and re-approximating with the same assumptions:

$$C_T\cong\sqrt{Q_{11}Q_{12}C_{m11}C_{m12}} \quad (14)$$

Substituting the expression for $C_T$ in (3) we find $$C_{13}=-C_{o11}-C_{l12}+\sqrt{Q_{11}Q_{12}C_{m11}C_{m12}} \qquad (15)$$

The expression 15 is the general expression for the value of a shunt connected capacitance required to give critical coupling to two cascaded piezoelectric transformers. The accuracy of the equation is usually better than 1% with the underlying assumptions that the effective Q's of the transformers exceed 100, and that the $C_m$'s of the transformers are within a range of 100 of one another. Accordingly, if one wishes to operate the transformers with loads producing effective Q's of less than 100 the accuracy of the Expression 15 is slightly reduced, as appears from a comparison with the more exact Expression 12.

Assuming similar transformers in which $C_{m11}$ and $C_{m12}$ are identically equal to $C_m$, $Q_{11}$ and $Q_{12}$ are identically equal to Q and further that the transformers are symmetrical as shown in FIGURE 1, so that $C_{l11}$, $C_{o11}$, $C_{l12}$ and $C_{o12}$ are all identically equal to $C_o$; the Expression 7 for $C_{13}$ simplifies to:

$$C_{13}=-2C_o+QC_m \qquad (16)$$

The quantity $C_o$ is rather directly obtained; likewise the ratio $C_o/C_m$. These two quantities may be equated to obtain $C_m$. For example, with polarization in the thickness direction as shown in FIGURE 1, it can be shown that $$\frac{C_o}{C_m}=\frac{\Pi^2}{4}\left(\frac{1}{k_{31}^2}-1\right) \qquad (17)$$

Solving Expression 17 for $C_m$:

$$C_m=\frac{C_o}{\frac{\Pi^2}{4}\left(\frac{1}{k_{31}^2}-1\right)} \qquad (18)$$

We may now substitute into Expression 16 the quantity for $C_m$ as defined in Expression 18

$$C_{13}=C_o\left[-2+\frac{Q}{\frac{\Pi^2}{4}\left(\frac{1}{k_{31}^2}-1\right)}\right] \qquad (19)$$

$C_o$ is obtained from the following expression:

$$C_o=[\epsilon_{33}^T(1-k_{31}^2)]\frac{A}{T} \qquad (20)$$

where $\epsilon_{33}^T(1-k_{31}^2)$ is the longitudinally clamped permittivity of the piezoelectric material employed. In M.K.S. units, this is the product of relative dielectric constant times the permittivity of free space, $8.854\times10^{-12}$.
A is the effective electrode area, and
T is the distance between electrodes.

Employing the values known for the body member employed in the first embodiment having a composition of ($Ba_{.92}Ca_{.08}TiO_3$), and employing metric units we find:

$$C_o=[1200(8.854\times10^{-12})]\left(\frac{0.25\times1\times0.254}{0.25}\right) \qquad (21)$$

where $\epsilon_{33}^T(1-k_{31}^2)=1200(8.854\times10^{-12})$
$C_o=270$ micromicrofarads.

The quantity $C_o$ may be determined by the use of published constants as indicated above. It may also be determined by direct measurement. A convenient way of doing this is to measure the electrical terminal impedance with an A.C. bridge, employing a voltage whose frequency is well above resonance.

$$C_{13}=270\left[-2+\frac{400}{2.468\left(\frac{1}{.04}-1\right)}\right] \qquad (22)$$

$$=1280\mu\mu f$$

where $Q_m=400$
$k_{31}=0.2$

The value of 1280 micromicrofarads calculated for the capacitor 13 is in close agreement with the observed experimental value, as an examination of the graph of FIGURE 2 leads one to believe.

The foregoing discussion has concerned itself with transformers which are transversely polarized with respect to their major axis. If one wishes to employ transformers in which the polarization is parallel to the major axis, for instance as shown in FIGURE 4, then different parameters such as the electromechanical coupling coefficient, $k_{33}$, and the electromechanical conversion ratio $\Phi_{33}$, come into play.

Using analysis like that above it may be demonstrated that for critical coupling $C_{13}$ should have the following value:

$$C_{13}=C_o\left[-2+\frac{Q_m}{\frac{\Pi^2}{4k_{33}^2}-1}\right] \qquad (23)$$

Applying the above calculation to a piezoelectric transformer of lead zirconate titanate ($P_bZr_{.55}Ti_{.45}O_3$) $3.6\times.6\times.6\times10^{-3}$ meters in dimensions, resonant at 455 kc. and having a value for $C_o$ of 1.95 micromicrofarads, $Q_m$ of 1000, $K_{33}$ of 0.63, we find that $C_{13}$ should be 370 micromicrofarads for critical coupling.

FIGURES 4, *5a*, *5b* and *5c* relate to a second embodiment of the invention in which a second method is employed for achieving critical coupling between two cascaded piezoelectric transformers. The cascaded piezoelectric transformers bear the reference numerals 35 and 36. They are of different design from those illustrated in FIGURE 1 although they operate on the same basic principle. The piezoelectric transformer 35 has an input electrode 37, a common electrode 38 and an output electrode 39. Each of these electrodes is applied to the body member 40, which is polarized longitudinally as indicated by the arrows 41. The electrode 38 is termed a "ring" electrode since it takes the form of a narrow conductive band applied to the surface of the piezoelectric body, encircling it in a plane perpendicular to the major axis of the piezoelectric body. The transformers 35 and 36 are of similar design, the piezoelectric transformer 36 also having an input electrode 42, a common electrode 43 and an output electrode 44 applied to the piezoelectric body 45. The piezoelectric body 45 is polarized in a direction parallel to the major axis as indicated by the arrows 46. Intercoupling of the piezoelectric transformers 35 and 36 is achieved by means of a capacitor 47 connected between the output electrode 39 of the piezoelectric transformer 35 and the input electrode 42 of the piezoelectric transformer 36. The other external connections of the piezoelectric transformers 35 and 36 are the same as illustrated with respect to the piezoelectric transformers employed in FIGURE 1. It has been found, that by appropriate selection of the value for the capacitor 47, the double peaked response which ordinarily occurs with piezoelectric transformers of known types may be made to disappear and critical coupling achieved.

A theoretical explanation of how critical coupling may be achieved may now be undertaken with reference to FIGURES *5a*, *5b* and *5c*. FIGURE *5a* is a simplified equivalent circuit representation of the filter shown schematically in FIGURE 4. It has been simplified in the manner generally indicated with respect to the first embodiment by consolidating the idealized transformers and eliminating them from the simplified drawing and by converting the mechanical quantities into electrical equivalents by the use of the ratio $\Phi_{33}$, now defined as:

$$\Phi_{33}=C_o\left(\frac{1}{d_{33}}\right)\left(\frac{k_{33}^2}{1-k_{33}^2}\right)L \qquad (24)$$

where $C_o$ is the appropriate clamped terminal capacitance, $d_{33}$ is the piezoelectric strain constant equal to the ratio of the strain to applied field, at constant stress condition and denoting a parallel relationship between the strain and the applied field, L is the length of the piezoelecric body, and $$k_{33}=d_{33}\sqrt{\frac{Y_3^E}{\epsilon_{33}^T}}$$

where $Y_3^E$ is Young's modulus, assuming a constant field, measured in a direction parallel to the polarization.

The reasoning supporting the simplification of FIGURE 5*a* is set forth particularly in the discussion relating to FIGURES 3*a* and 3*b* of the preceding embodiment. FIGURE 5*b* represents a further simplification of the portion of the equivalent circuit diagram shown in FIGURE 5*a* in the dotted outline 48. It illustrates the application of a further transformation whereby the series capacitance $C_{m35}$ and the shunt capacitance $C_{o35}$ arising in the output of piezoelectric transformer 35 may be replaced by an idealized electrical transformer (shown in FIGURE 5*b* and having a ratio of 1 to *a*), a shunt capacitance $C'_{o35}$ and series capacitance $C'_{m35}$. In a similar fashion, the shunt capacitance $C_{i36}$ and the series capacitance $C_{m36}$ arising at the input of the piezoelectric transformer 36 may be replaced by a circuit as shown in FIGURE 5*b* comprising a series capacitance $C'_{m36}$ and a new shunt capacitance $C'_{i36}$ followed by an idealized electrical transformer having a ratio of *b* to 1. It may now be seen, that if the capacitance $C'_{m35}$, $C'_{o35}$, $C_{47}$, $C'_{m36}$ and $C'_{i36}$ are treated together, that they form a composite pi type capacitance network as shown in FIGURE 5*c* having two shunt capacitors $C_1$ and $C_2$, and a series capacitor $C_3$. The coupling properties of such a network are well known, and by use of an appropriate size for the capacitor $C_{47}$, one may control the coupling coefficient of the two circuits.

A mathematical analysis of the second embodiment illustrated in FIGURE 4 utilizing the transformations illustrated in FIGURES 5*a*, 5*b* and 5*c* leads to the following expression defining the coupling coefficient in terms of the capacitances $C_1$, $C_2$ and $C_3$ of FIGURE 5*c*.

$$\frac{1}{K^2}=\left(\frac{C_1}{C_3}+1\right)\left(\frac{C_2}{C_3}+1\right) \qquad (25)$$

where $$C_1=C_{o35}\left(1+\frac{C_{o35}}{C_{m35}}\right)$$

$$C_2=C_{i36}\left(1+\frac{C_{i36}}{C_{m36}}\right)$$

$$C_3=\frac{1}{\frac{1}{C_{m35}\left(1+\frac{C_{o35}}{C_{m35}}\right)}+\frac{1}{C_{47}}+\frac{1}{C_{m36}\left(1+\frac{C_{i36}}{C_{m36}}\right)}}$$

The relationship expressed in the above equation is rather cumbersome if expressed in terms of the ultimate parameters of terminal capacitances and compliant capacitances and for that reason it is preferable to use the indicated statement. If we now wish to find an expression for $C_{47}$ at critical coupling, we may proceed by noting that at critical coupling:

$$K^2Q_{35}Q_{36}=1;\ K^2=\frac{1}{Q_{35}Q_{36}} \qquad (8)$$

$$\frac{K^2}{1-K^2}=\frac{1}{\frac{1}{K^2}-1}=\frac{1}{Q_{35}Q_{36}-1}\cong\frac{1}{Q_{35}Q_{36}} \qquad (26)$$

which, assuming that $Q_{35}$ and $Q_{36}$ have a minimum value of 100, is accurate to one part in 10,000.

Solving Expression 25 for $C_3$:

$$C_3=\frac{K^2}{1-K^2}\left(\frac{C_1+C_2}{2}\right)\left\{1\pm\sqrt{1+4\left(\frac{1-K^2}{K^2}\right)\frac{C_1C_2}{(C_1+C_2)^2}}\right. \qquad (27)$$

Simplifying 27 by resort to Expression 26:

$$C_3\cong\frac{C_1+C_2}{2Q_{35}Q_{36}}\left\{1+\sqrt{1+\frac{4}{Q_{35}Q_{36}}\left[\frac{C_1/C_2}{(C_1/C_2+1)^2}\right]}\right\} \qquad (28)$$

Expression 28 may be further simplified by recognizing that:

$$\sqrt{1+\frac{4}{Q_{35}Q_{36}}\left[\frac{C_1/C_2}{(C_1/C_2+1)^2}\right]}\sim\sqrt{1} \qquad (29)$$

Which relation, assuming $Q_{35}$, $Q_{36}$ each have a minimum value of 100; and that the capacitance ratio $C_1/C_2$ equals one, the most unfavorable assumption, is accurate to greater than one part in 10,000.

$$C_3\cong\frac{C_1+C_2}{Q_{35}Q_{36}} \qquad (30)$$

Substituting into Expression 30 the values defined for $C_1$, $C_2$ and $C_3$ in Expression 25, we find the following relation defining $C_{47}$, the coupling reducing capacitance:

$$\frac{1}{C_{47}}\cong\frac{Q_{35}Q_{36}}{C_{o35}\left(1+\frac{C_{o35}}{C_{m35}}\right)+C_{i36}\left(1+\frac{C_{i36}}{C_{m36}}\right)}-\frac{1}{C_{m35}\left(1+\frac{C_{o35}}{C_{m35}}\right)}-\frac{1}{C_{m36}\left(1+\frac{C_{i36}}{C_{m36}}\right)} \qquad (31)$$

At this point, we may observe that we have obtained an expression for $C_{47}$ having an accuracy usually exceeding 1 part in 10,000. Since the Expression 31 is still rather complicated, we may simplify it by further approximation. If we assume as before that $Q_{35}$ and $Q_{36}$ exceed 100, and that the ratios $$\frac{C_{o35}}{C_{m35}},\ \frac{C_{i36}}{C_{m36}}$$

never exceed 100, as is the case with all currently used ferroelectric materials, then we may neglect the last two terms of Expression 31, and still retain an accuracy usually exceeding 1% in defining $C_{47}$ for critical coupling:

$$C_{47}=\frac{1}{Q_{35}Q_{36}}\left[C_{o35}\left(1+\frac{C_{o35}}{C_{m35}}\right)+C_{i36}\left(1+\frac{C_{i36}}{C_{m36}}\right)\right] \qquad (32)$$

Applying this equation to the arrangement shown in FIGURE 4, we may make $C_{o35}$, $C_{i36}$ identically equal to $C_o$, $C_{m35}$, $C_{i36}$ identically equal to $C_m$; and $Q_{35}$, $Q_{36}$ identically equal to Q:

$$C_{47}=\frac{2C_o}{Q^2}\left(1+\frac{C_o}{C_m}\right) \qquad (33)$$

In the ring type transformer illustrated in FIGURE 4, $C_o$ and $C_m$ have the following values:

$$C_o=\frac{A}{(L/2)}\epsilon_{33}^T(1-k_{33}^2) \qquad (34)$$

$$C_m=\frac{C_o}{\left(\frac{2}{4k_{33}^2}-1\right)} \qquad (35)$$

It may be observed that these equations define slightly different values for $C_o$ and $C_m$ in the second embodiment from those defined in the first embodiment. In general, this arises from differences in orientation of the fields of polarization requiring the use of different piezoelectric coupling coefficients.

If we now desire to determine the value for the capacitor $C_{47}$ which will bring about critical coupling, the Relations 33, 34, and 35 may be employed.

It has been found with certain transformers that a series coupling reducing capacitance is to be favored over a shunt coupling reducing capacitance, and vice versa. The geometry of the transformer and its composition influence the decision. If a transformer of the type illustrated in FIGURE 4 is employed, i.e. one that is longitudinally polarized, and the composition is $PbZr_{.55}Ti_{.45}O_3$, then we find that to achieve critical coupling the capacitor $C_{47}$ must be impractically small. If, however, a transverse type of transformer is employed, and a transformer of the same dimensions is considered, i.e. one resonant at 455 kilocycles, the value obtained for the capacitance $C_{47}$ becomes more convenient, being 0.72 micromicrofarad.

If one desires to compare the use of a series or shunt capacitor with respect to the transformer described in the first embodiment made of the material initially considered, transversely polarized, and resonant at 42 kilocycles, we find that a value for series capacitance $C_{47}$ of 58 micromicrofarads will bring about critical coupling as contrasted to a value of 1280 micromicrofarads for a shunt capacitance.

It should be further understood that while the above examples and methods of mathematical solutions lead one to a close approximation of the correct value of the capacitance required for bringing about critical coupling, the external loading of the circuit modifies the circuit Q so that the coupling coefficients in any particular circuit are somewhat reduced. This loading effect can in general be corrected by small adjustments of the coupling reducing capacitance. The loading effect may be predicted with considerable accuracy by summing all loss terms, both internal and external of the individual piezoelectric transformers and employing it to determine the effective Q used in the circuit equations.

It may thus be seen, that applicant has indeed provided a very simple arrangement for cascading two highly selective mechanically resonant piezoelectric devices which would normally provide a highly over coupled response curve, in such a fashion that the over-coupled condition may be completely removed and critical coupling achieved. It may be further observed that the sole circuit requirements for achieving this controlled coupling reduction are a single capacitance of appropriate value coupled either in series between the cascaded piezoelectric transformers or in shunt with the coupled terminals.

In order to simplify the understanding of the invention, applicant has shown illustrative arrangements in which both transformers were alike, and in which both sections of the transformers were similar. In practice, the invention is also applicable to filters using non-symmetrical transformers, e.g. transformers in which the input section is transversely polarized, while the output section is longitudinally polarized. Likewise, non-similar transformers may be used in the input and the output positions of the overall filter.

While particular embodiments of the invention have been shown and described, it should be understood that the invention is not limited thereto and it is intended in the appended claims to claim all such variations as fall in the true spirit of the present invention.

What I claim as new and desire to secure by Letters Patent of the United States is:

1. A band pass filter of the coupled resonant circuit type including a first piezoelectric transformer having a mechanically resonant body member of piezoelectric material, input and output terminals for respectively applying electric potentials to said body member to cause mechanical vibrations therein and for deriving from said induced vibrations an output electrical potential, said body member exhibiting a compliant capacitance of a predetermined value, a second piezoelectric transformer having a second mechanically resonant body member of piezoelectric material, resonant at a frequency near that of said first body member, and having input and output terminals, said second body member exhibiting a second compliant capacitance, said first and second transformers normally exhibiting an over-coupled characteristic when directly cascaded, each of said input and output terminals having associated clamped capacitance therebetween, and a capacitor interconnected between said first output terminals and said second input terminals to form in combination with said compliant capacitances and said clamped capacitances an equivalent capacitive coupling network, said capacitor having a value proportioned in relation to said compliant capacitances and said clamped capacitances to provide a predetermined reduced electrical coupling coefficient between said transformers.

2. A band pass filter of the coupled resonant circuit type including a first piezoelectric transformer having a mechanically resonant body member of piezoelectric material, input and output terminals for respectively applying electric potentials to said body member to cause mechanical vibrations therein and for deriving from said induced vibrations an output electrical potential, said body member exhibiting a compliant capacitance of a predetermined value, a second piezoelectric transformer having a second mechanically resonant body member of piezoelectric material, resonant at a frequency near that of said first body member, and having input and output terminals, said second body member exhibiting a second compliant capacitance, said first and second transformers normally exhibiting an over-coupled characteristic when directly cascaded, each of said input and output terminals having associated clamped capacitance therebetween, means coupling said first output terminals to said second input terminals, and a capacitor shunting said coupled terminals, said capacitor forming in combination with said compliant capacitances and said clamped capacitances an equivalent T capacitive coupling network and having a value proportioned in relation to said compliant capacitances and said clamped capacitances to produce a predetermined reduced electrical coupling coefficient between said transformers.

3. A band pass filter of the coupled resonant circuit type including a first piezoelectric transformer having a mechanically resonant body member of piezoelectric material, input and output terminals for respectively applying electric potentials to said body member to cause mechanical vibrations therein and for deriving from said induced vibrations an output electrical potential, said body member exhibiting a compliant capacitance of a predetermined value, a second piezoelectric transformer having a second mechanically resonant body member of piezoelectric material, resonant at a frequency near that of said first body member, and having input and output terminals, said second body member exhibiting a second compliant capacitance, said first and second transformers normally exhibiting an over-coupled characteristic when directly cascaded, means coupling said first output terminals to said second input terminals, and a capacitor shunting said coupled terminals, said capacitor forming in combination with said compliant capacitances an equivalent T capacitive coupling network and having a value to produce approximately critical coupling between said transformers.

4. A band pass filter of the coupled resonant circuit type including a first piezoelectric transformer having a mechanically resonant body member of piezoelectric material, input and output terminals for respectively applying electric potentials to said body member to cause mechanical vibrations therein and for deriving from said induced vibrations an output electrical potential, said body member exhibiting a compliant capacitance of a predetermined value, a second piezoelectric transformer having a second mechanically resonant body member of piezoelectric material, resonant at a frequency near that of said first body member, and having input and output terminals, said second body member exhibiting a second compliant capacitance, said first and second transformers normally exhibiting an over-coupled characteristic when directly cascaded, means coupling one of said first output terminals to one of said second input terminals, and a capacitor coupled between the other of said first output terminals and the other of said second input terminals, said capacitor having a value proportioned in relation to said compliant capacitances to produce a predetermined reduced electrical coupling coefficient between said transformers.

5. A band pass filter of the coupled resonant circuit type including a first piezoelectric transformer having a mechanically resonant body member of piezoelectric material, input and output terminals for respectively applying electric potentials to said body member to cause mechanical vibrations therein and for deriving from said induced vibrations an output electrical potential, said body member exhibiting a compliant capacitance of a predetermined value, a second piezoelectric transformer having a second mechanically resonant body member of piezoelectric material, resonant at a frequency near that of said first body member, and having input and output terminals, said second body member exhibiting a second compliant capacitance, said first and second transformers normally exhibiting an over-coupled characteristic when directly cascaded, means coupling one of said first output terminals to one of said second input terminals, and a capacitor coupled between the other of said first output terminals and the other of said second input terminals, said capacitor having a value to produce approximately critical coupling between said transformers.

6. A band pass filter of the coupled resonant circuit type including a first piezoelectric transformer having a mechanically resonant body member of piezoelectric material, input and output terminals for respectively applying electric potentials to said body member to cause mechanical vibrations therein and for deriving from said induced vibrations an output electrical potential, said body member exhibiting a compliant capacitance of a predetermined value, a second piezoelectric transformer having a second mechanically resonant body member of piezoelectric material, resonant at a frequency near that of said first body member, and having input and output terminals, said second body member exhibiting a second compliant capacitance, said first and second transformers normally exhibiting an over-coupled characteristic when directly cascaded, means coupling said first output terminals to said second input terminals, and a capacitor shunting said coupled terminals, said capacitor forming in combination with said compliant capacitances an equivalent T capacitive coupling network and having a value substantially equal to the geometric mean of the respective products of the compliant capacitance and the Q of each of said coupled transformers.

7. A band pass filter of the coupled resonant circuit type including a first piezoelectric transformer having a mechanically resonant body member of piezoelectric material, input and output terminals for respectively applying electric potentials to said body member to cause mechanical vibrations therein and for deriving from said induced vibrations an output electrical potential, said body member exhibiting a compliant capacitance of a predetermined value, a second piezoelectric transformer having a second mechanically resonant body member of piezoelectric material, resonant at a frequency near that of said first body member, and having input and output terminals, said second body member exhibiting a second compliant capacitance, said first and second transformers normally exhibiting an over-coupled characteristic when directly cascaded, means coupling said first output terminals to said second input terminals, and a capacitor shunting said coupled terminals, said capacitor forming in combination with said compliant capacitances an equivalent T capacitive coupling network and having a value approximately equal to the geometric mean of the product of the Q of the first transformer and its compliant capacitance and the product of the Q of the second transformer and its compliant capacitance, less the sum of the terminal capacitances of said transformers at their coupled terminals.

8. A band pass filter of the coupled resonant circuit type including a first piezoelectric transformer having a mechanically resonant body member of piezoelectric material, input and output terminals for respectively applying electric potentials to said body member to cause mechanical vibrations therein and for deriving from said induced vibrations an output electrical potential, said body member exhibiting a compliant capacitance of a predetermined value, a second piezoelectric transformer having a second mechanically resonant body member of piezoelectric material, resonant at a frequency near that of said first body member, and having input and output terminals, said second body member exhibiting a second compliant capacitance, said first and second transformers normally exhibiting an over-coupled characteristic when directly cascaded, means coupling one of said first output terminals to one of said second input terminals, and a capacitor coupled between the other of said first output terminals and the other of said second input tetrminals, said capacitor having a value approximately equal to $$\frac{1}{Q_1Q_2}\left[C_{o1}\left(1+\frac{C_{o1}}{C_{m1}}\right)+C_{i2}\left(1+\frac{C_{i2}}{C_{m2}}\right)\right]$$

where $C_{o1}$, and $C_{i2}$ are the respective clamped capacitances at the coupled terminals of said piezoelectric transformers, $C_{m1}$ and $C_{m2}$ are the respective compliant capacitances of said piezoelectric transformers, and $Q_1$, $Q_2$ are the respective Q's of said transformers.

References Cited in the file of this patent

UNITED STATES PATENTS

| | | |
|---|---|---|
| 1,978,475 | Posthumus et al. | Oct. 30, 1934 |
| 2,199,921 | Mason | May 7, 1940 |
| 2,248,776 | Och | July 8, 1941 |
| 2,253,942 | Rath | Aug. 26, 1941 |
| 2,373,431 | Sykes | Apr. 10, 1945 |
| 2,830,274 | Rosen et al. | Apr. 8, 1958 |

FOREIGN PATENTS

| | | |
|---|---|---|
| 796,611 | France | Jan. 27, 1936 |

OTHER REFERENCES

Terman: Radio Engineering, Third Edition, McGraw-Hill Book Co., Inc., New York, 1947, pages 58–69.